US 8,647,938 B1

(12) United States Patent
Baars et al.

(10) Patent No.: US 8,647,938 B1
(45) Date of Patent: Feb. 11, 2014

(54) SRAM INTEGRATED CIRCUITS WITH BURIED SADDLE-SHAPED FINFET AND METHODS FOR THEIR FABRICATION

(75) Inventors: Peter Baars, Dresden (DE); Matthias Goldbach, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/571,190

(22) Filed: Aug. 9, 2012

(51) Int. Cl.
H01L 21/336 (2006.01)

(52) U.S. Cl.
USPC ............................ 438/197; 438/587; 257/390

(58) Field of Classification Search
USPC .................................. 438/197, 587; 257/390
See application file for complete search history.

(56) References Cited

U.S. PATENT DOCUMENTS

| 7,932,148 B2* | 4/2011 | Chang et al. ................... 438/259 |
| 2006/0197137 A1 | 9/2006 | Mouli |
| 2010/0006945 A1 | 1/2010 | Merelle et al. |
| 2010/0041198 A1* | 2/2010 | Zhu et al. ...................... 438/283 |
| 2012/0012932 A1* | 1/2012 | Perng et al. ................... 257/347 |

OTHER PUBLICATIONS

Office Action issued Oct. 1, 2013 in German Patent Application No. 10 2013 202 739.7.

\* cited by examiner

*Primary Examiner* — Timor Karimy
(74) *Attorney, Agent, or Firm* — Ingrassia Fisher & Lorenz, P.C.

(57) ABSTRACT

SRAM ICs and methods for their fabrication are provided. One method includes depositing photoresist on a first oxide layer overlying a silicon substrate, forming a pattern of locations, using said photoresist, for the formation of two inverters, each having a pull up transistor, a pull down transistor, and a pass gate transistor on said oxide layer. The method involves anisotropically etching U-shaped channels in the oxide layer corresponding to pattern, and thereafter isotropically etching U-shaped channels in the silicon layer to form saddle-shaped fins in the silicon. A second oxide layer is deposited over the saddle-shaped fins, and a first metal layer is deposited over the second oxide layer. A contact metal layer is formed over the first metal layer and planarized to form local interconnections coupling the gate electrodes of one inverter to a node between the pull up and pull down transistors of the other inverter and to a source/drain of one of the pass gate transistors.

18 Claims, 11 Drawing Sheets

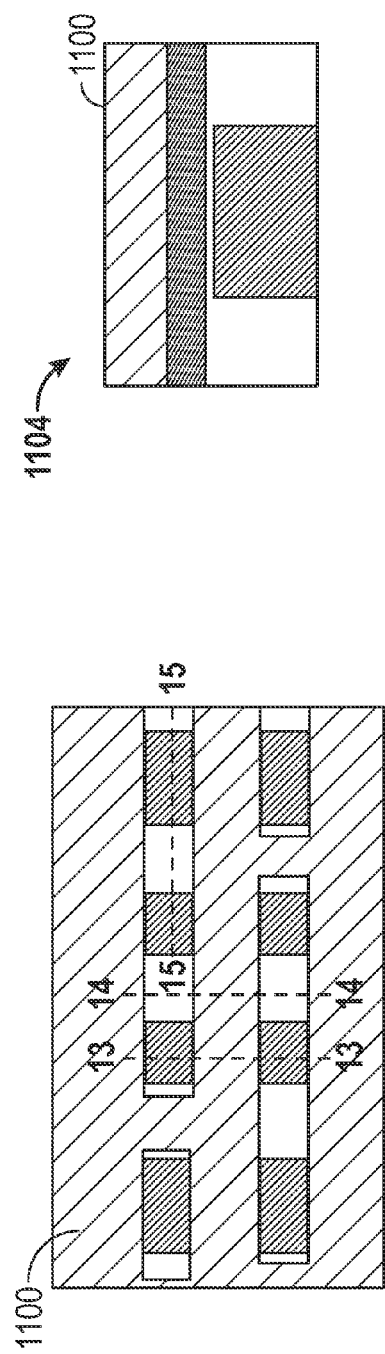
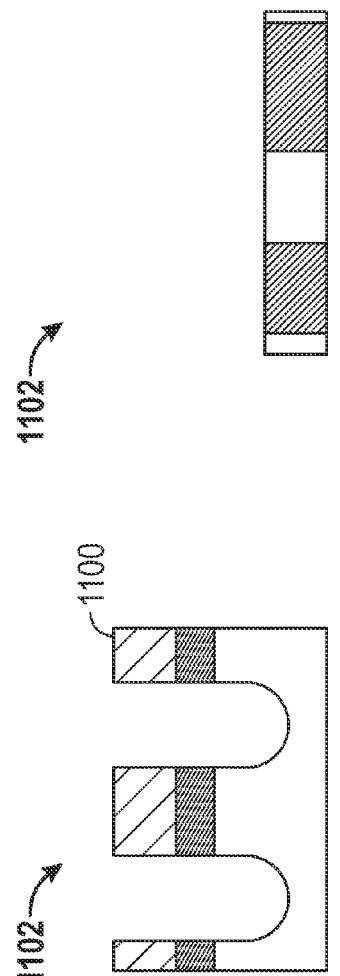
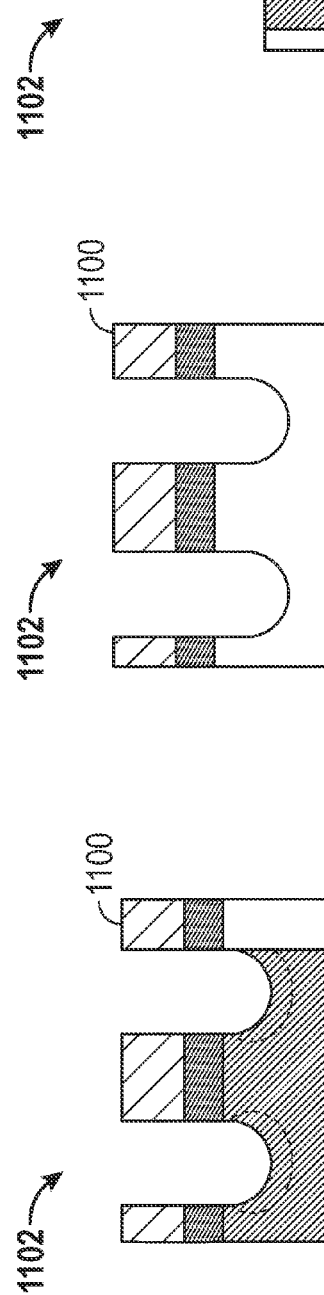
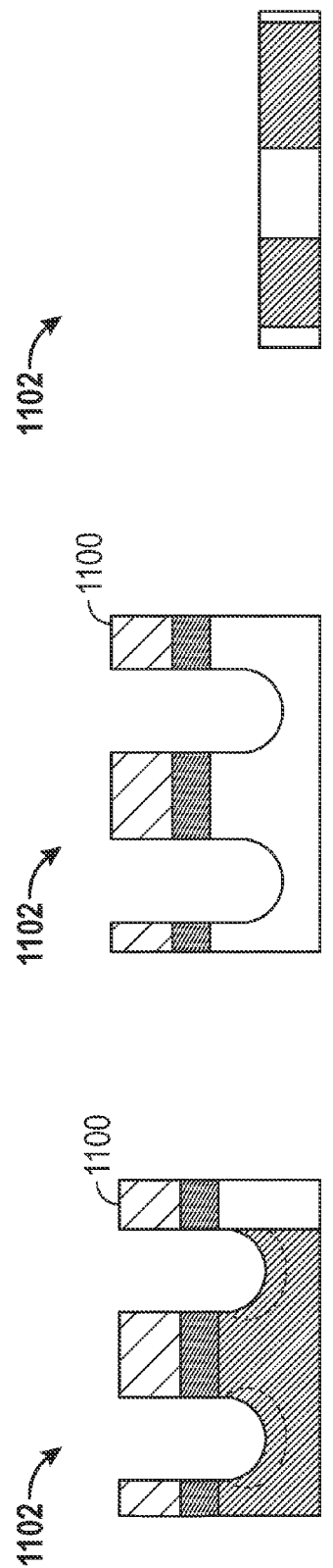
FIG. 11
FIG. 12
FIG. 13
FIG. 14
FIG. 15

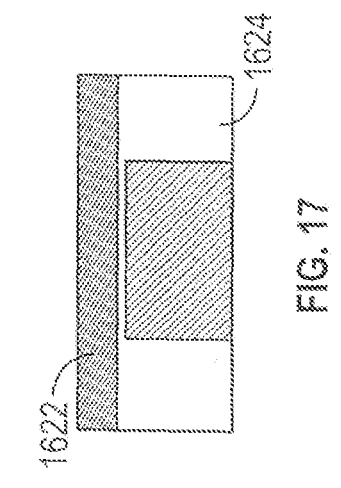
FIG. 16
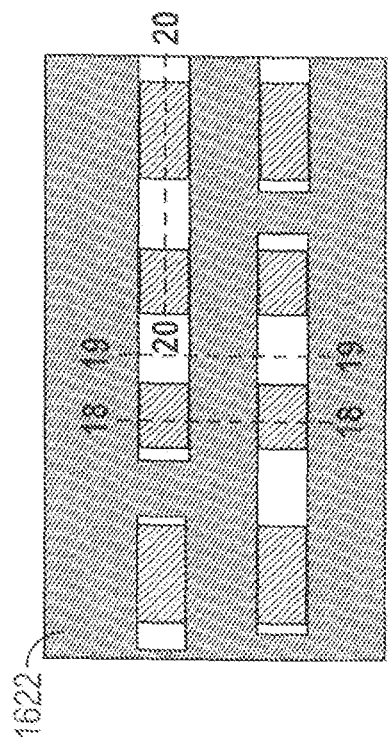
FIG. 17
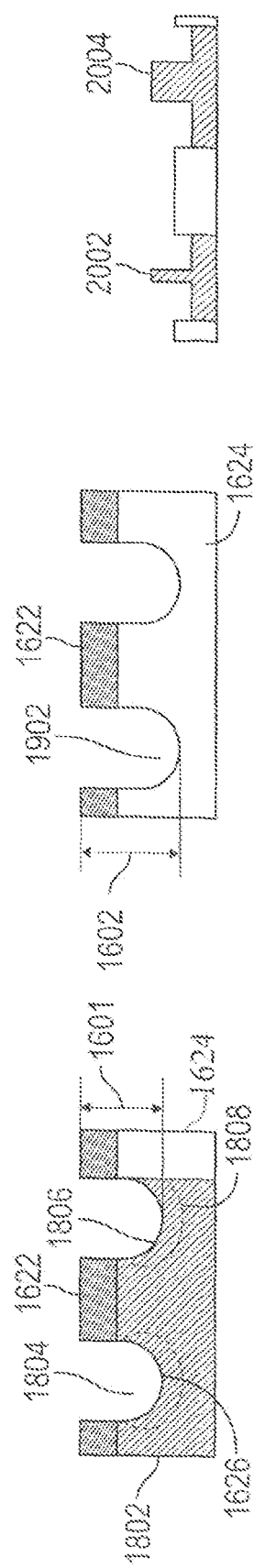
FIG. 18
FIG. 19
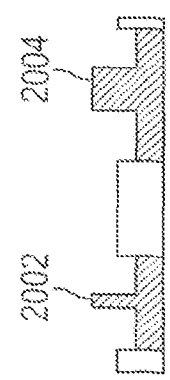
FIG. 20

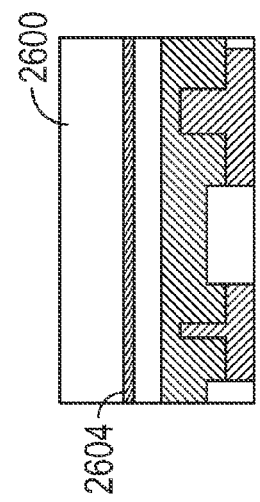
FIG. 30
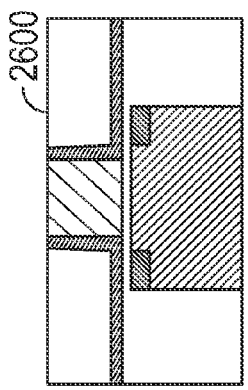
FIG. 27
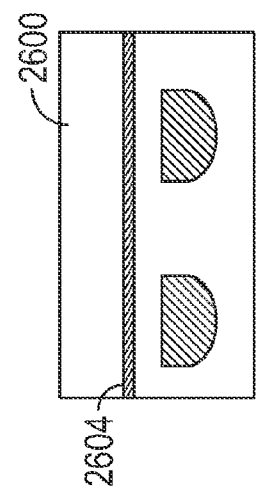
FIG. 29
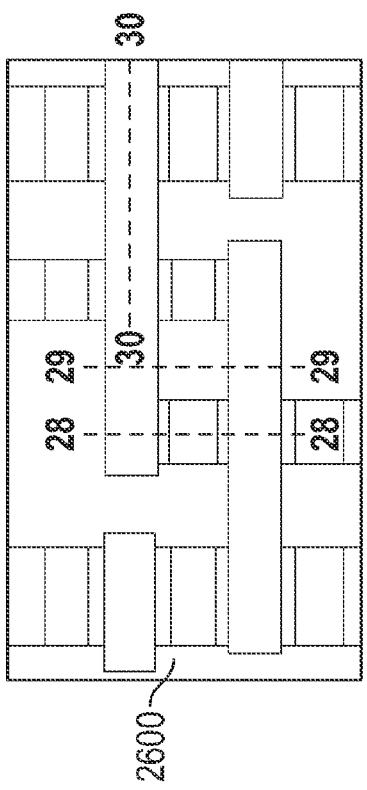
FIG. 26
FIG. 28

SRAM INTEGRATED CIRCUITS WITH BURIED SADDLE-SHAPED FINFET AND METHODS FOR THEIR FABRICATION

TECHNICAL FIELD

The present invention generally relates to SRAM integrated circuits and to methods for their fabrication, and more particularly relates to SRAM integrated circuits fabricated with buried U-shaped FINFETs and to methods for fabricating such integrated circuits.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors and memory arrays, can include millions of FETs. For such ICs, decreasing transistor size and thus increasing transistor density remains a high priority in the semiconductor manufacturing industry. Transistor performance, however, must be maintained even as the transistor size decreases.

Static random access memory (SRAM) integrated circuits (ICs) are widely used, both as stand-alone memories and as embedded memories in, for example, microprocessors. The size of such SRAM ICs has increased markedly so that memories in excess of one million bits are now common. As IC size has increased, so has the processing complexity. The increased IC size requires a reduction in the size of individual components and in the minimum feature size, the minimum width of lines and spaces within an individual component. Processing complexity increases as the feature size decreases because it becomes difficult to precisely define lines and to ensure adequate spacing between features on different processing levels.

Presently known SRAM cells include six transistors and require at least three levels of metal in addition to the gate electrode level. Reliably processing the multiple layers of conductors and the necessary contacts to those conductor levels is difficult, especially when the minimum feature size shrinks to the range of 20 nanometers (nm) or less.

It is also known that high performance field effect transistors (FETs) can be formed in fin-like semiconductor structures, commonly referred to as "FINFETs". Integrated circuits (ICs), including SRAM cells, are fabricated using such FINFETS. Unlike conventional planar FETs, with FINFETs the semiconductor region containing the source-drain channel has a fin-like shape standing approximately perpendicular to the surface of the substrate die or wafer on which the device is formed. Gate electrodes can be provided on both exposed sides of the fin-like channel region and sometimes along the narrow top edge, although such edge gates are not required. The term "tri-gate" is used to refer to fin-type FETs that have the gate along the narrow top edge as well as along the sides. As used herein, the term "FINFET", singular or plural, is intended to include all such variations.

A FINFET transistor lends itself to the dual goals of reducing transistor size while maintaining transistor performance. Transistor performance, often measured by its transconductance, is proportional to the width of the transistor channel. In a FINFET the transistor channel is formed at least along the vertical sidewalls of the fin, to facilitate the formation of a wide channel, and thereby increase performance, without significantly increasing the area of the substrate surface required by the transistor.

Even with FINFETs, however, reducing the device size (and, hence, feature size) introduces fabrication problems. Such problems include adverse short channel effects as the gate length shrinks and the attendant variation in threshold voltage (the minimum gate voltage necessary to turn a transistor "ON") from random dopant fluctuations in the channel. Variations or fluctuations in threshold voltage (Vt), in turn, can lead to mismatched and unmatched transistors. One solution is to fabricate transistors with undoped channels, but fabricating such transistors can be difficult, particularly with devices formed on a bulk semiconductor wafer. Due to the lack of dopant in a fully depleted body, there is little or no random dopant fluctuation driven Vt mismatch, and random telegraph noise (RTN) becomes a limiting matching mechanism for SRAM cells. Process optimization can improve RTN; Vt-mismatch due to RTN is also scaling with area, so that maximizing gate area remains an important objective for future large SRAM arrays.

For low SRAM-cell leakage, gate induced drain leakage (Gidl) is another limiting factor. The increasing doping concentration directly at the gate is needed in order to obtain the drive current for the SRAM devices. This contributes to increasing Gidl.

Accordingly, it is desirable to provide an SRAM integrated circuit having buried FINFETs. In addition, it is desirable to provide methods for fabricating SRAM integrated circuits having buried FINFETS with reduced complexity and increased reliability. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating an SRAM integrated circuit. In accordance with one embodiment, the method involves depositing photoresist on a first oxide layer overlying a silicon substrate; forming a pattern of locations, using the photoresist, for the formation of two pull up transistors, two pull down transistors, and two pass gate transistors on the oxide layer. Fins are formed by anisotropically etching U-shaped channels in the oxide layer corresponding to the pattern, and thereafter isotropically etching U-shaped channels in the silicon layer to form saddle-shaped fins in the silicon. A second oxide layer is deposited over the saddle-shaped fins, and a first metal layer is deposited on the second oxide layer.

In another embodiment, an SRAM cell includes two buried pull up FINFET transistors, two buried pull down FINFET transistors, two buried pass gate FINFET transistors; a first cross couple contact configured to electrically interconnect a first pull up transistor, a first pull down transistor, and a first pass gate transistors; and a second cross couple contact configured to electrically interconnect a second pull up transistor, a second pull down transistor, and a second pass gate transistor; wherein each of the buried FINFET transistors are U-shaped. In an alternate embodiment, the U-shaped FINFET transistors are saddle shaped.

BRIEF DESCRIPTION OF THE DRAWINGS

The present invention will hereinafter be described in conjunction with the following drawing figures, wherein like numerals denote like elements, and wherein:

FIG. 11 is a top view of an SRAM cell as part of an SRAM integrated circuit following a non-selective oxide/poly etch processing step for forming buried FINFETs;

FIG. 12 is a cross-section view of the logic area associated with FIG. 11;

FIG. 13 is a cross-section view along line 13-13 of FIG. 11;

FIG. 14 is a cross-section view along line 14-14 of FIG. 11;

FIG. 15 is a cross-section view along line 15-15 of FIG. 11;

FIG. 16 is a top view of an SRAM cell as part of an SRAM integrated circuit following the fin formation processing steps;

FIG. 17 is a cross-section view of the logic area associated with FIG. 16;

FIG. 18 is a cross-section view along line A-A of FIG. 16;

FIG. 19 is a cross-section view along line B-B of FIG. 16;

FIG. 20 is a cross-section view along line C-C of FIG. 16;

FIG. 26 is a top view of an SRAM cell as part of an SRAM integrated circuit following replacement gate processing steps;

FIG. 27 is a cross-section view of the logic area associated with FIG. 26, illustrating a replacement gate;

FIG. 28 is a cross-section view along line A-A of FIG. 26;

FIG. 29 is a cross-section view along line B-B of FIG. 26;

FIG. 30 is a cross-section view along line C-C of FIG. 26;

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
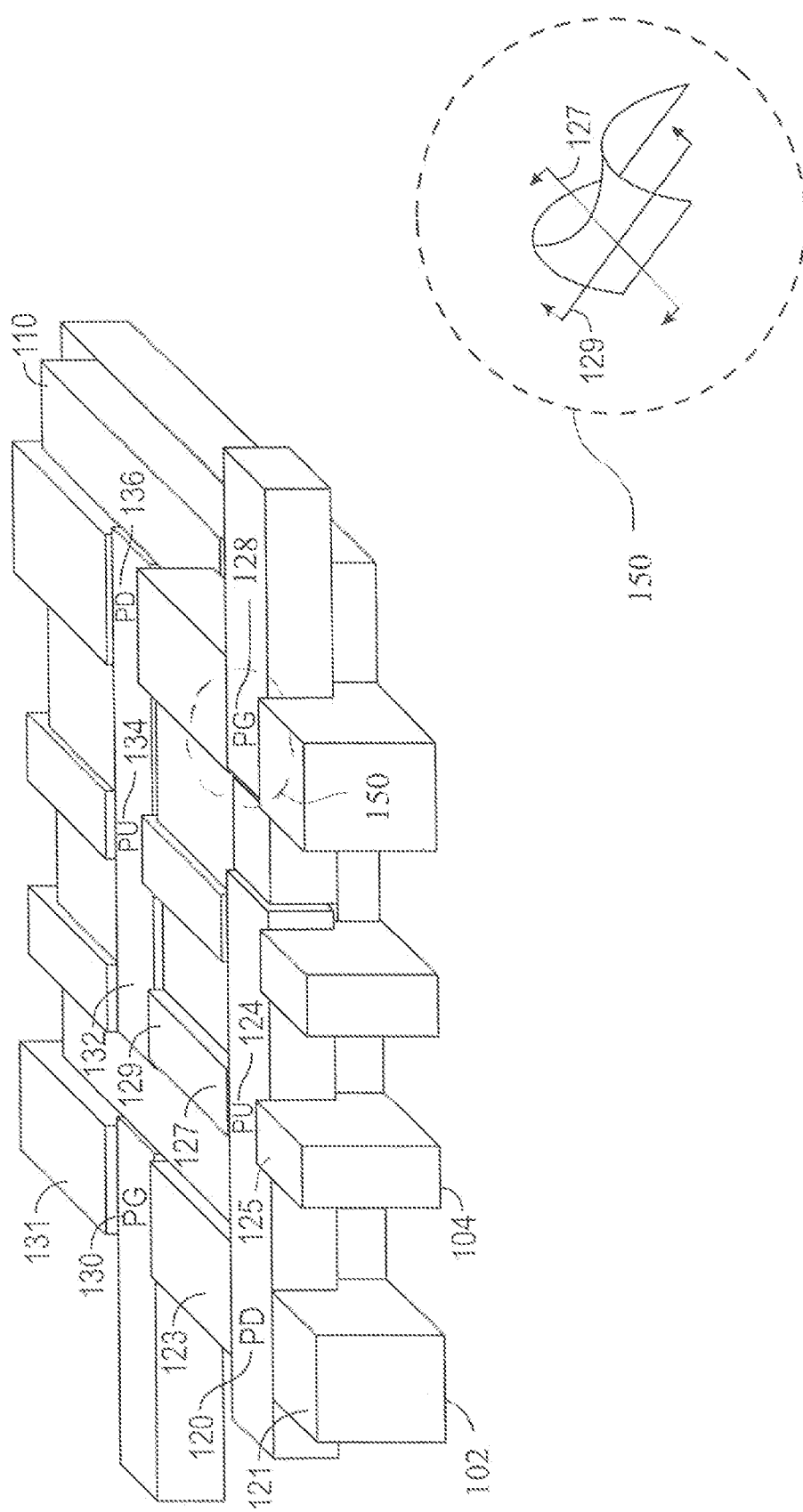
FIG. 1 is a perspective view of an exemplary schematic layout of a six transistor SRAM cell as part of an SRAM integrated circuit having buried U-shaped FINFETs.

FIG. 1 is perspective view of an exemplary schematic layout of a six transistor SRAM cell 100 having buried U-shaped (or saddle shaped) FINFETs. In an SRAM integrated circuit (IC) such a cell would be reproduced many times in a regular array of rows and columns. RAM cell 100 includes six transistors: respective pull up transistors 124 and 134; respective pull down transistors 120 and 136; and respective pass gate transistors 128 and 130. Each transistor includes spaced apart source and drain regions formed in a semiconductor substrate, separated by a gate electrode which selectively controls the flow of current through a channel extending between the source and drain. The gate electrode is electrically insulated from the underlying channel by a gate dielectric. Such MOS transistors can be P-channel (PMOS) or N-channel (NMOS).

For example, pull down transistor 120 includes a source region 121 and a drain region 123 formed in a semiconductor (e.g., silicon) substrate block 102. Pull up transistor 124 includes a source region 125 and a drain region 127 formed in a semiconductor substrate block 104. Pass gate transistor 130 shares a common drain region with pull down transistor 120, and further includes a source region 131, also formed in semiconductor substrate block 102. Although the actual transistor devices are buried and hence hidden from view in FIG. 1, these buried FINFET devices resemble a U-shape or saddle shape, as illustrated in the blow up window 150. This U-shape, and the manner of fabricating multiple U-shaped devices, are described in detail below.

Figure 3:
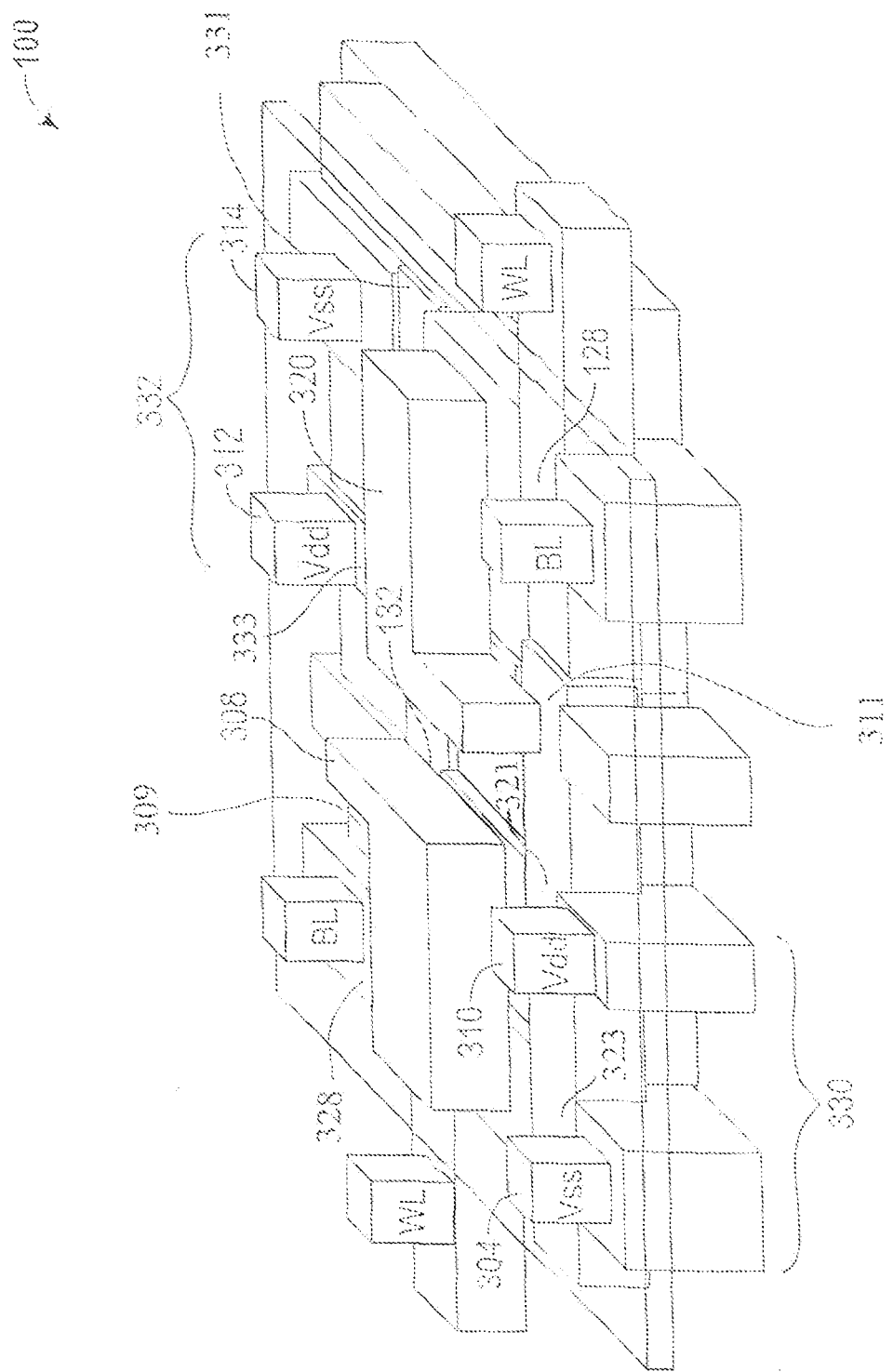
FIG. 3 is a schematic perspective view of the SRAM cell as part of the SRAM integrated circuit of FIG. 2 illustrating contact formation.

Referring now to FIG. 3, SRAM cell 100 further includes two cross coupled inverters 330 and 332. The first inverter 330 includes pull up transistor 124 and pull down transistor 120 joined at a common cross couple contact and interconnect 308. The second inverter 332 includes pull up transistor 134 and a pull down transistor 136 having a common cross couple contact and interconnect 320. Cross coupling of the two inverters is facilitated by extending the cross couple contacts down to the buried devices. The sources of pull up transistors 124 and 134 are coupled to a first potential source $V_{DD}$ corresponding to metal contacts 310 and 312, respectively, and the sources of pull down transistors 120 and 136 are coupled to a second potential source $V_{SS}$ corresponding to metal contacts 304 and 314, respectively. The cell is accessed for reading or writing by respective pass gate transistors 128 and 130 (See FIGS. 1 and 3).

As is well known, integrated circuits such as SRAM integrated circuits are formed in and on a semiconductor substrate with the fabrication process involving a series of photolithographic processing steps in which a layer of photosensitive material is exposed to radiation that passes through a photo mask to transfer images from the photo mask to the layer of photosensitive material. The layer of photosensitive material is then developed and the resulting patterned mask is used as a process mask for etching, ion implantation, or other process steps.

In the conventional approach three levels of metal are needed above the gate level to complete the SRAM cell. The contacts for the three levels of metal must be etched through two different thicknesses of insulator because they make contact to the cell at different levels (gate electrode level and active silicon level). The SRAM layout is very dense, and correctly etching the contacts is critical to the fabrication process of those levels. As the feature size is reduced, it becomes more and more difficult to correctly and reliably etch the contacts. Metal layer one is typically used for local connections in the SRAM cell and for wiring through to metal layer two. The third layer of metallization in the SRAM cell increases restrictions on overlay and on critical dimensions of the layer and therefore increases the complexity of the fabrication process.

An improved SRAM IC having buried U-shaped FINFETs and methods for fabricating such an IC, in accordance with various embodiments, are described herein. Various steps in the fabrication of MOS semiconductor devices are well known and so, in the interest of brevity, many conventional steps will only be mentioned briefly herein or will be omitted entirely without providing the well-known process details. While the term "MOS" properly refers to a device having a metal gate electrode overlying an oxide gate insulator, that term will be used herein to refer to any device having a gate electrode, whether metal or other conductive material, overlying a gate insulator, whether oxide or other dielectric material, which overlies a semiconductor substrate.

In accordance with one embodiment, the method for fabricating an SRAM IC having buried U-shaped or saddle shaped FINFETs begins with a recognition that a saddle or U-shaped FINFET allows the transistor gate length to be increased (relative to a rectangular gate configuration) in the range of 30-40% without compromising transistor density within a given volume of an SRAM cell. In this regard, although saddle shaped FINFETs have been proposed, the present invention involves a novel and non-obvious technique of burying saddle shaped FINFETs in the context of an SRAM IC.

Figure 2:
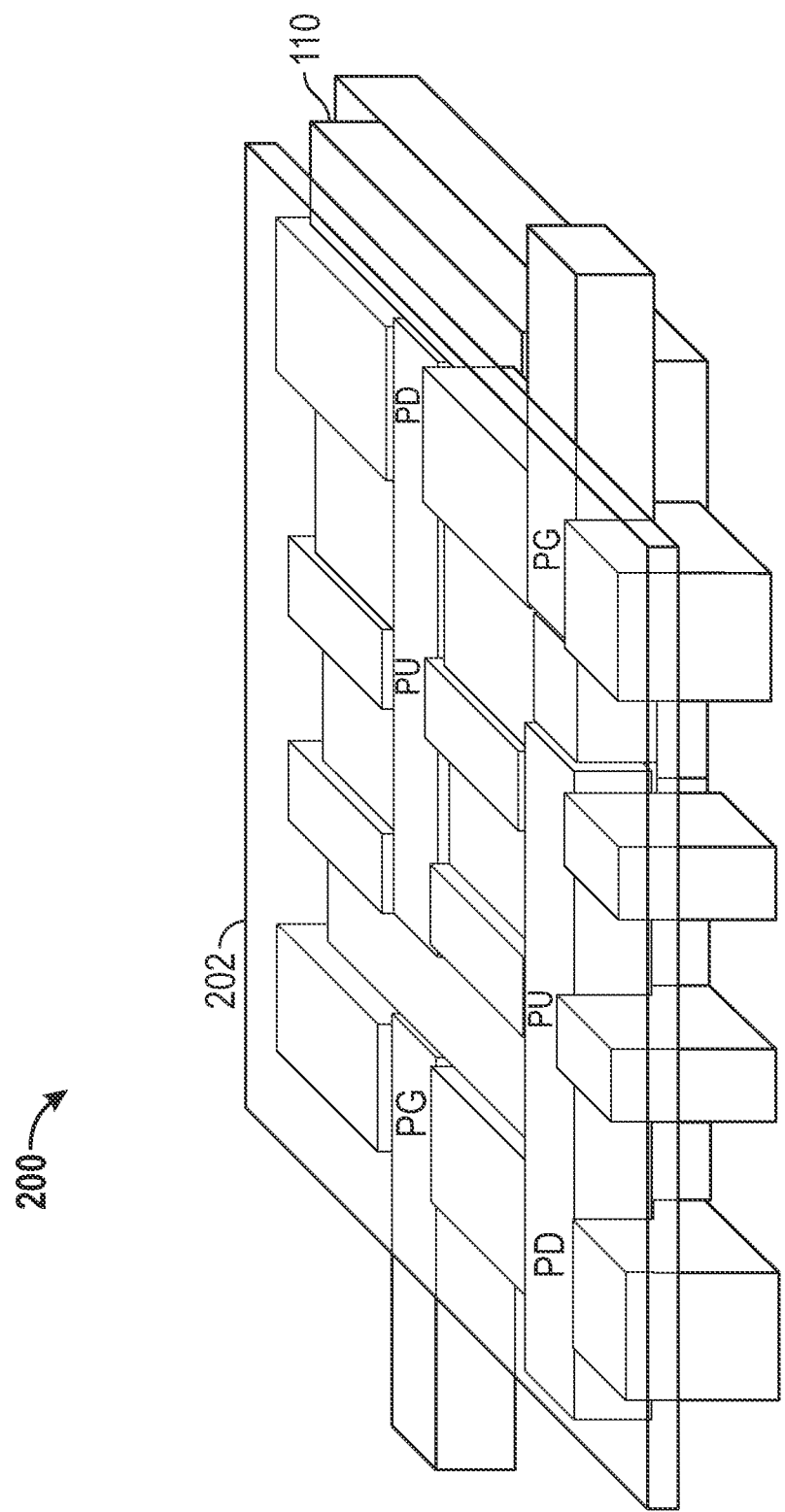
FIG. 2 is a schematic perspective view of the SRAM cell as part of the SRAM integrated circuit of FIG. 1 illustrating a post oxide fill processing step.

Referring now to FIG. 2, an SRAM cell 200 is shown following the formation of a post oxide fill layer 202 onto SRAM cell 200 (corresponding to SRAM cell 100 of FIG. 1). More particularly, process steps relating to the formation of replacement gates is done in the peripheral logic areas of the IC (not shown), and not in the active region or memory area of the IC since the FINFETs are buried under the metal layer (as described in greater detail below). The particular process steps involved in replacement gate integration are well known and need not be described in further detail here.

Referring again to FIG. 3, the metal contacts which implement the cross coupling of the inverters, also referred to as the wiring of the SRAM cell, will now be described. More particularly, a total of eight devices are shown in the embodiment of FIG. 3. Of these, six are active transistors and two are not active. The six active transistors are pull up transistors 321 and 333, pull down transistors 323 and 331, and pass gate transistors 128 and 328. Respective non-active devices 309 and 311 are shorted from their gate to the drains of the neighboring pull up transistors by respective cross contact and interconnect metals 308 and 320. They are used solely for wiring to effect the cross coupling and interconnection of respective inverters 330 and 332 via respective interconnects 308 and 320.

Figure 4:
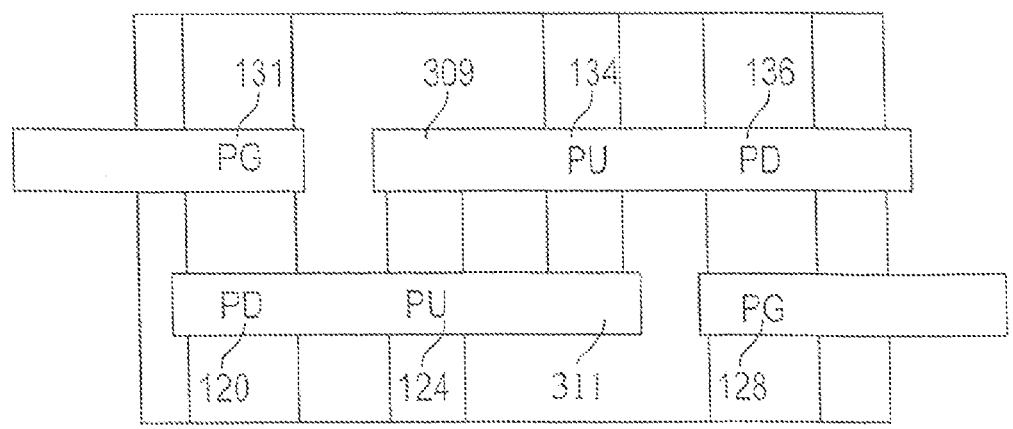
FIG. 4 is a top view of the SRAM cell as part of the SRAM integrated circuit of FIG. 1.
Figure 5:
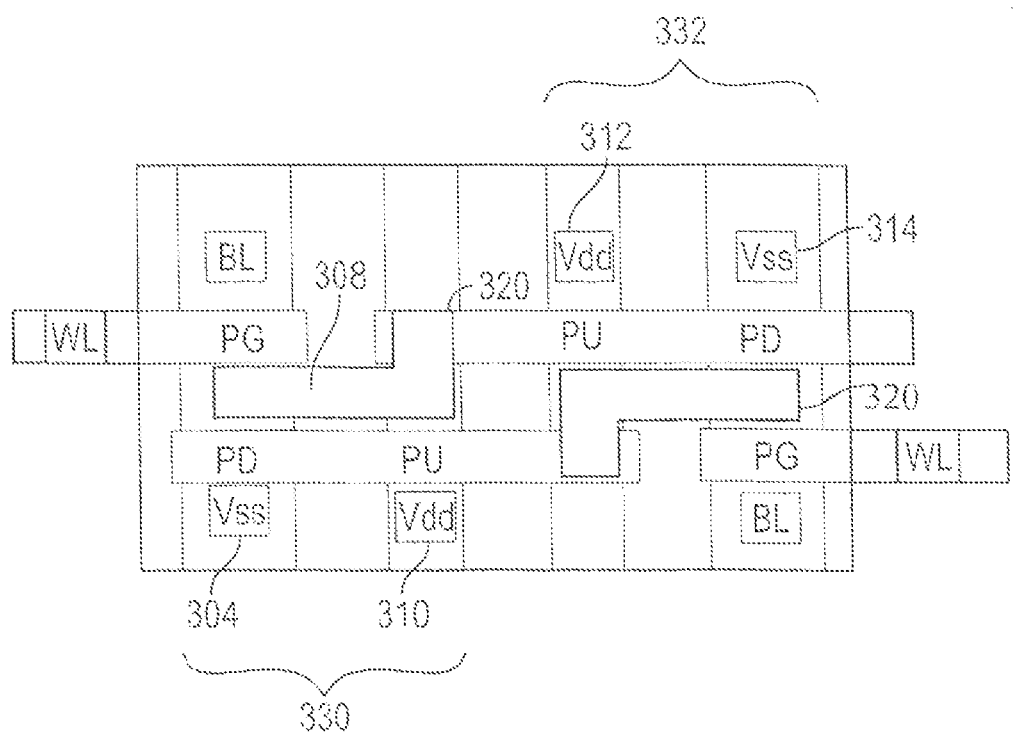
FIG. 5 is a top view of the SRAM cell as part of the SRAM integrated circuit of FIG. 3.

Referring now to FIG. 4, a top view of the SRAM cell 100 of FIG. 1 includes pull up transistors 124 and 134, pull down transistors 120 and 136, pass gate transistors 128 and 131, and non-active connections 309 and 311. FIG. 5 is a top view of the SRAM cell 300 of FIG. 3, and includes inverters 330 and 332 having respective first potential source (VDD) contacts 310, 312, respective second potential source (VSS) contacts 304, 314, and respective cross couple contact and interconnects 308 and 320.

The process steps for fabricating buried saddle-shaped FINFETs within an SRAM cell will now be described in connection with FIGS. 6-35.

Figure 6:
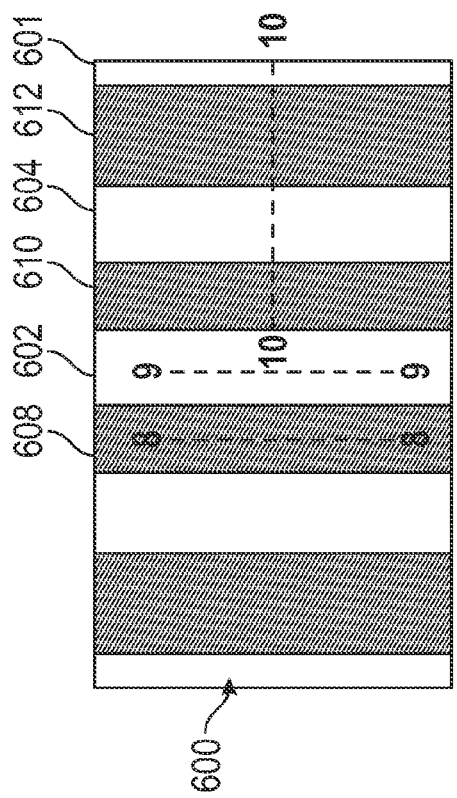
FIG. 6 is a top view of an SRAM cell as part of an SRAM integrated circuit following a nitride hard mask processing step for forming buried FINFETs.
Figure 7:
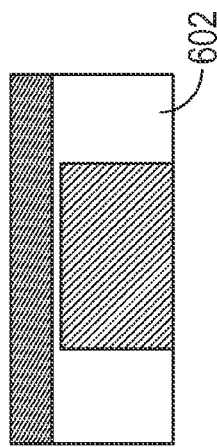
FIG. 7 is a cross-section view of the logic area associated with FIG. 6.
Figure 8:
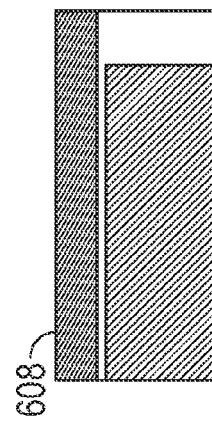
FIG. 8 is a cross-section view along line 8-8 of FIG. 6.
Figure 9:
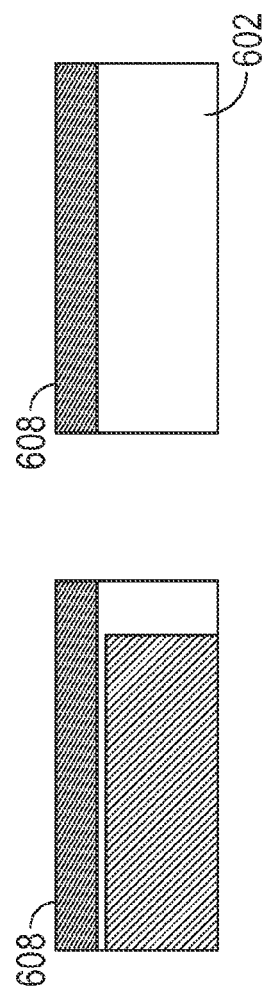
FIG. 9 is a cross-section view along line 9-9 of FIG. 6.
Figure 10:
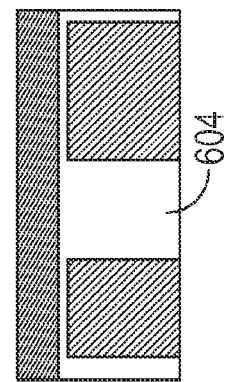
FIG. 10 is a cross-section view along line 10-10 of FIG. 6.
Figure 22:
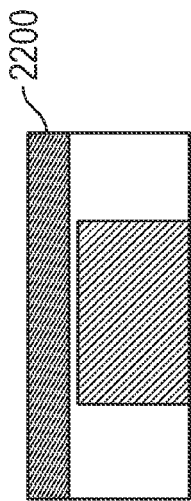
FIG. 22 is a cross-section view of the logic area associated with FIG. 21.
Figure 25:
FIG. 25 is a cross-section view along line 25-25 of FIG. 21.
Figure 21:
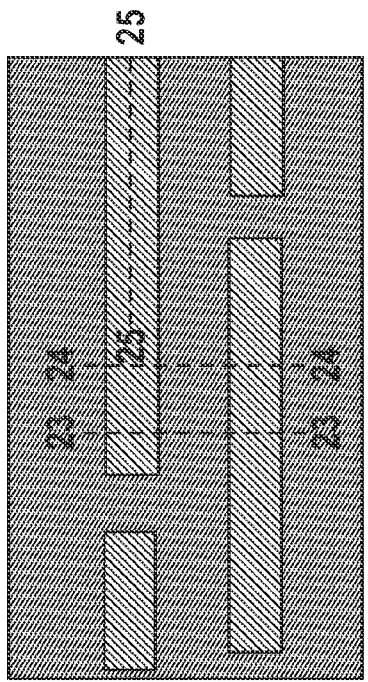
FIG. 21 is a top view of an SRAM cell as part of an SRAM integrated circuit following gate oxide, metal fill, and metal recess RIE processing steps.

FIG. 6 is a top view of an SRAM cell 600 having respective oxide regions 602, 604, and respective nitride layers 608, 610, and 612. Following STI formation and surface oxidation, S/D implants can be performed for the nmos- and and pmos- devices, respectively, for the SRAM region. Then a nitride hard mask deposition step is performed in the active region for the buried FINFET process. FIG. 7 is a side cross section view of the peripheral logic region of SRAM cell 600. FIG. 8 is a cross section view through the silicon taken along line A-A of FIG. 6. FIG. 9 is a cross section view through the oxide taken along line B-B in FIG. 6, and FIG. 10 is a cross section view through the silicon and oxide taken along line C-C of FIG. 6.

Referring now to FIGS. 11-15, lithography and etching processing steps for forming buried saddle shaped FINFETs are performed in the active areas. Initially, a hard mask (e.g., carbon/SiON) layer 1100 is deposited over the entire substrate including both the active (memory) area 1102 and peripheral logic area 1104. As explained below, the hard mask remains over the logic region to protect it during processing of the active (SRAM) region. The process sequence for the buried FINFETs is similar to that of the buried wordline, which is standard in the industry for DRAM fabrication.

More particularly, a buried FINFET (BF) lithography step is performed, creating a pattern in the silicon for the formation of the buried FINFETs. This is followed by a BF etch step, for example, a non-selective oxide/silicon etch to create the pattern of U-shaped structures for the subsequent formation of the buried FINFETs. FIG. 12 is a side cross section view of the logic area, which is protected from the aforementioned lithography and etching steps by the hard mask. FIG. 13 is a cross section view illustrating the U-shaped structures through the hard mask, nitride, oxide, and silicon taken along line A-A in FIG. 11. FIG. 14 is a cross section view through the hard mask, nitride, and oxide taken along line B-B in FIG. 11. FIG. 15 is a cross section view through a gate region taken along line C-C in FIG. 11.

Turning now to FIGS. 16-20, the resist (hard mask) 1100 previously laid down in FIG. 11 is stripped (removed). Fin formation then proceeds with an anisotropic STI recess (etch) of the oxide layer, followed by isotropic thinning of the silicon. FIG. 16 is a top view of the SRAM cell of FIG. 11, with the hard mask layer 1100 removed. FIG. 17 is a cross section of the peripheral logic area of the SRAM IC, which is unaffected by the aforementioned fin formation steps. FIG. 18 is a cross section view through the nitride 1622, oxide 1624, and silicon 1626 taken along line A-A in FIG. 16. FIG. 19 is a cross section view through the nitride and oxide taken along line B-B in FIG. 16, and FIG. 20 is a cross section through the gate region taken along line C-C in FIG. 16.

With continued reference to FIGS. 18 and 19, the U-shaped channels 1804 are initially etched in the silicon to a depth 1601, forming the top 1806 of the each fin. Isotropic active thinning widens the channels 1804 (from left to right in FIG. 18) as indicated by dashed lines 1802, to form the bottom 1808 of each fin. The silicon is isotropically etched to a depth 1602 corresponding to the depth of channels 1902 in the oxide. This active area thinning (silicon thinning) has the effect of thinning the fins formed in the silicon, forming buried saddle shaped structures.

The resulting saddle shaped silicon fins are illustrated in FIG. 20, which shows a pull up fin 2002 and a somewhat wider pull down fin 2004. This saddle configuration generally corresponds to the fin 122 shown in blow up box 150 of FIG. 1. In particular, the view along line A-A in FIG. 16 (shown in FIG. 18) is analogous to the view along line 129 in FIG. 1, and the view along line C-C in FIG. 16 (shown in FIG. 20) is analogous to the view along line 127 in FIG. 1.

Figure 24:
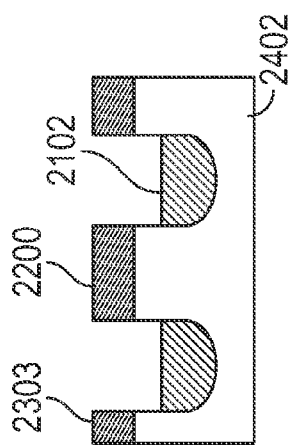
FIG. 24 is a cross-section view along line 24-24 of FIG. 21.
Figure 23:
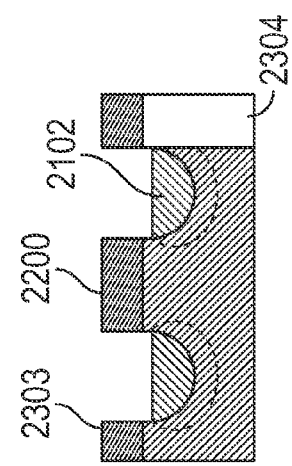
FIG. 23 is a cross-section view along line 23-23 of FIG. 21.
Figure 32:
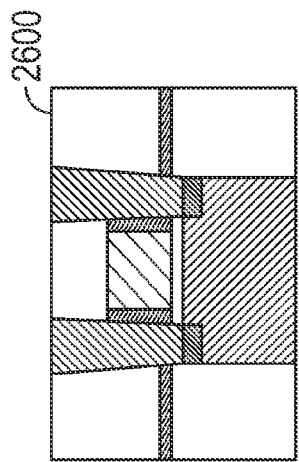
FIG. 32 is a cross-section view of the logic area associated with FIG. 31, illustrating a replacement gate and contacts.
Figure 31:
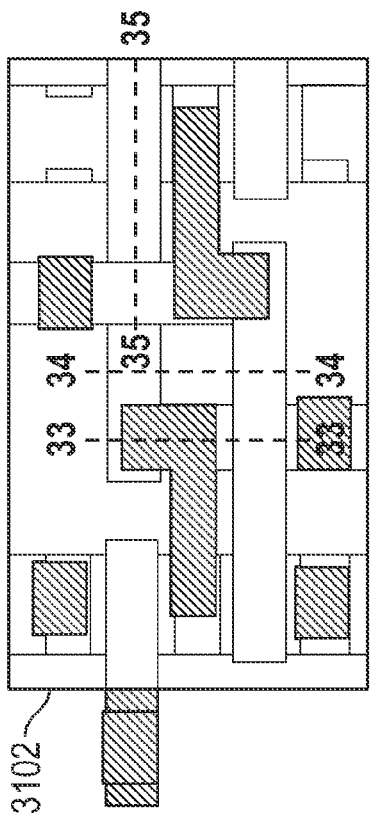
FIG. 31 is a top view of an SRAM cell as part of an SRAM integrated circuit following contact formation processing steps.
Figure 35:
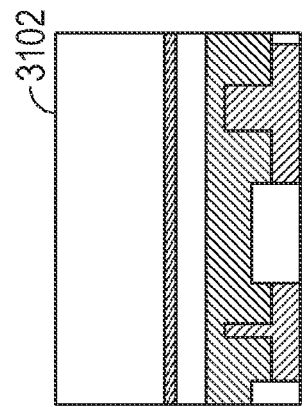
FIG. 35 is a cross-section view along line C-C of FIG. 31.
Figure 34:
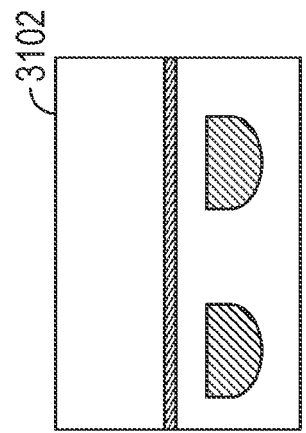
FIG. 34 is a cross-section view along line B-B of FIG. 31.
Figure 33:
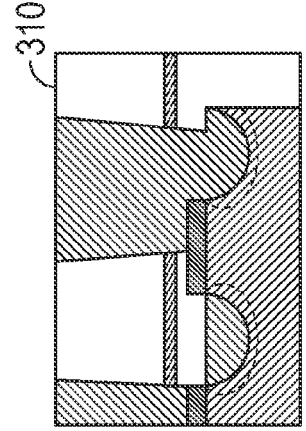
FIG. 33 is a cross-section view along line A-A of FIG. 31.

Referring now to FIGS. 21-25, the process steps associated with laying the metal lines for fabricating the FINFET transistors on the saddle shaped silicon fins will now be described. The process begins with gate oxide formation (not shown), followed by depositing a metal fill (typically overfill) layer 2102, and a CMP polishing step to remove the excess metal down to the top surface 2300 of the nitride 2200. This is followed by a reactive ion etch (RIE) in the u-shaped areas of the silicon 2304 (FIG. 23) and oxide 2402 (FIG. 24). The RIE metal recess is selective to nitride; that is, it protects the nitride and only etches the metal.

If the IC includes a low leakage SRAM, a midgap work function allows the same metal to be used for both n-type and p-type devices. If, on the other hand, a high performance SRAM is involved, two different work function (WF) metals may be deposited and patterned for n-FET and p-FET devices, using standard techniques (i.e., using successive lithography masks and wet etches).

Referring now to FIGS. 26-30, the process steps associated with dummy gate and replacement gate formation in the logic area, and FINFET cap formation in the active region are shown. The S/D implants can be used also in the SRAM-region to realize the S/D doping of the U-shaped FINFETs. Alternatively, S/D implantation may be performed both before the U-shaped FINFET formation (as described above in connection with FIG. 6) and together with logic S/D implantation for tuning reasons. The process begins with laying down an oxide fill layer 2600, polishing it down using CMP (stopping at the nitride layer 2604), followed by a deglazing (oxide etch) step and a nitride strip. Replacement gates are formed in the logic area, and FINFET caps are formed in the active region, all in accordance with well known, standard processes and materials.

Referring now to FIGS. 31-35, the process steps associated with contact formation, i.e., building the cross couple contacts and interconnects shown in FIG. 3, will now be described. An oxide cap 3102 is initially laid down to protect the gates previously formed in the logic region. Contact formation involves depositing a hard mask, photolithographic patterning, and etching down through the oxide layer (using RIE) to create the contact holes, stopping on the active silicon. A barrier layer (e.g., titanium nitride) is deposited in the holes, followed by filling (typically overfilling) the holes with metal (e.g., tungsten,) followed by CMP, all in accordance with standard techniques and materials.

In accordance with one embodiment, the foregoing metal contacts are finally planarized to form at least: gate electrodes; source/drain contacts; contacts to nodes that couple the pass gate transistors, common nodes between pull up and pull down transistors, and cross coupled gate electrodes; and contacts for coupling the pull up transistors to a potential node (e.g., $V_{DD}$) and the pull down transistors to another potential node (e.g., $V_{SS}$). The gate electrode material thus forms local interconnects that: couple the gate electrodes of each pull up transistor to its associated pull down transistor to form a common gate electrode; couple each pull up transistor to its associated pull down transistor at a common inverter node; couple the common gate electrode to the common inverter node between the pull up and pull down transistors of the opposite inverter pair; couple the source/drain of the pass gate transistors to the common inverter nodes; and provide for the SRAM cell to be coupled to potential sources $V_{DD}$ and $V_{SS}$.

Figure 36:
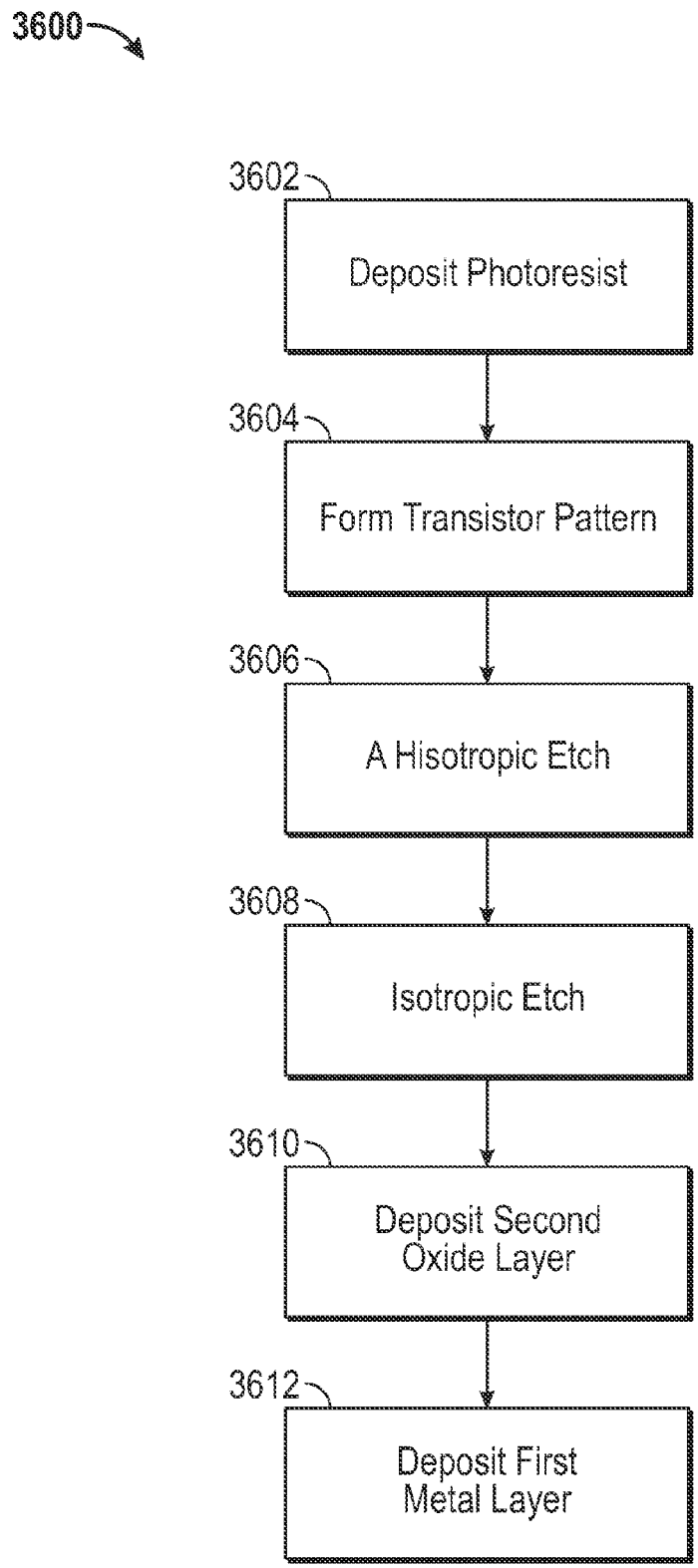
FIG. 36 is a flow chart setting forth various process steps associated with the fabrication of an SRAM device having buried saddle-shaped FINFETSs.

Referring now to FIG. 36, an exemplary process 3600 for fabricating SRAM ICs in accordance with one embodiment involves depositing (Step 3602) a layer of photoresist on a first oxide layer overlying a silicon substrate, and forming (Step 3604) a pattern of locations, using the photoresist, for the formation of two pull up transistors, two pull down transistors, and two pass gate transistors on the oxide layer. The method 3600 further includes anisotropically etching (Step 3606) U-shaped trenches in the oxide layer corresponding to the pattern of transistors, followed by isotropically etching (Step 3608) U-shaped channels in the silicon layer to form saddle-shaped fins in the silicon. A second oxide layer is then deposited (Step 3610) over the saddle-shaped fins. Finally, a first metal layer is deposited (Step 3612) over the second oxide layer.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an SRAM integrated circuit (IC), comprising:
   depositing photoresist on a first oxide layer overlying a silicon substrate;
   forming a pattern of locations, using said photoresist, for the formation of two pull up transistors, two pull down transistors, and two pass gate transistors on said first oxide layer;
   anisotropically etching U-shaped channels in said first oxide layer corresponding to said pattern;
   isotropically etching U-shaped channels in said silicon substrate to form saddle-shaped fins in the silicon;
   depositing a second oxide layer over said saddle-shaped fins; and
   depositing a first metal layer on said second oxide layer.

2. The method of claim 1, further comprising:
   forming gate electrodes and local interconnections coupling one of the pull up transistors and one of the pull down transistors to a node between the other of the pull up transistors and pull down transistors and to a source/drain of one of the pass gate transistors.

3. The method of claim 1, wherein depositing photoresist comprises depositing said photoresist over both an active area and a logic area of said SRAM IC.

4. The method of claim 1 further comprising photolithographically patterning said photoresist.

5. The method of claim 1, further comprising removing said photoresist from said active region prior to said anisotropic etching.

6. The method of claim 1, wherein said anisotropic etching comprises STI recess etching of said first oxide layer.

7. The method of claim 1, further comprising forming both n-FET and p-FET transistors.

8. The method of claim 7, wherein said method comprises forming a low leakage SRAM.

9. The method of claim 8, wherein depositing said first metal layer comprises depositing a single metal species.

10. The method of claim 7, wherein said method comprises forming a high performance SRAM.

11. The method of claim 10, wherein depositing said first metal layer comprises depositing two separate metal work functions.

12. A method of claim 1, further comprising:
   forming replacement gates in the logic region of said SRAM IC; and
   forming FET caps in the active area of said SRAM IC.

13. The method of claim 1, further comprising forming a contact metal layer over said pull up transistors, said pull down transistors, and said pass gate transistors.

14. A method for fabricating an SRAM integrated circuit (IC), comprising:
   depositing photoresist on a first oxide layer overlying a silicon substrate;
   forming a pattern of locations, using said photoresist, for the formation of two pull up transistors, two pull down transistors, and two pass gate transistors on said oxide layer;
   anisotropically etching U-shaped channels in said oxide layer corresponding to said pattern;
   isotropically etching U-shaped channels in said silicon layer to form saddle-shaped fins in the silicon;
   depositing a second oxide layer over said saddle-shaped fins;
   depositing a first metal layer on said second oxide layer;
   forming a contact metal layer over said pull up transistors, said pull down transistors, and said pass gate transistors; and
   planarizing said contact metal layer to form: gate electrodes; source/drain contacts; contacts to nodes that couple the pass gate transistors, common nodes between pull up and pull down transistors, and cross coupled gate electrodes; and contacts for coupling the pull up transistors to a first potential node and the pull down transistors to a second potential node.

15. The method of claim 14, wherein said first potential node corresponds to $V_{DD}$, and said second potential node corresponds to $V_{SS}$.

16. The method of claim 14, further comprising depositing a barrier layer over said transistors prior to depositing said metal contact layer.

17. The method of claim 16, wherein depositing said barrier layer comprises depositing titanium nitride, and depositing said metal contact layer comprises depositing tungsten.

18. An SRAM cell made by the method of claim 14.

* * * * *